United States Patent
Maniwa

(10) Patent No.: US 8,896,372 B2
(45) Date of Patent: Nov. 25, 2014

(54) AMPLIFICATION APPARATUS

(71) Applicant: Fujitsu Limited, Kawasaki-shi (JP)

(72) Inventor: Toru Maniwa, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 13/748,719

(22) Filed: Jan. 24, 2013

(65) Prior Publication Data

US 2013/0229227 A1      Sep. 5, 2013

(30) Foreign Application Priority Data

Mar. 5, 2012   (JP) ................. 2012-047505

(51) Int. Cl.
| | | |
|---|---|---|
| H03F 3/68 | (2006.01) | |
| H03F 1/02 | (2006.01) | |
| H03F 1/56 | (2006.01) | |
| H03F 3/24 | (2006.01) | |
| H03F 3/60 | (2006.01) | |

(52) U.S. Cl.
CPC .............. *H03F 3/68* (2013.01); *H03F 1/0294* (2013.01); *H03F 1/56* (2013.01); *H03F 3/24* (2013.01); *H03F 3/602* (2013.01); *H03F 2200/423* (2013.01)
USPC ....................................... 330/124 R; 330/295

(58) Field of Classification Search
USPC ................. 330/124 R, 295, 84, 286, 53–54
See application file for complete search history.

(56) References Cited

U.S. PATENT DOCUMENTS

| | | | |
|---|---|---|---|
| 7,221,219 B2 | 5/2007 | Hellberg et al. | |
| 8,576,010 B2 * | 11/2013 | Yanduru et al. | 330/295 |

FOREIGN PATENT DOCUMENTS

| | | |
|---|---|---|
| JP | 03-232306 | 10/1991 |
| JP | 05-037263 | 2/1993 |
| JP | 10-322136 | 12/1998 |
| JP | 2000-349575 | 12/2000 |
| JP | 2008-135829 A | 6/2006 |
| JP | 2007-535828 | 12/2007 |
| JP | 2008-099115 | 4/2008 |
| WO | WO-2004/057755 A1 | 7/2004 |
| WO | WO-2004/088837 | 10/2004 |

OTHER PUBLICATIONS

Extended European Search Report dated Oct. 4, 2013 for corresponding European Application No. 13153661.7.
KROA—Korean Office Action issued on Sep. 22, 2014 for corresponding Korean Application No. 10-2013-16530, with English-language translation.

* cited by examiner

*Primary Examiner* — Hieu Nguyen
(74) *Attorney, Agent, or Firm* — Fujitsu Patent Center

(57) ABSTRACT

A first amplification section and a second amplification section included in an amplification apparatus amplify two constant amplitude signals generated by vector decomposition. An impedance inverting circuit inverts the impedance of the signal amplified by the second amplification section. A combining circuit corrects the phases of the signal amplified by the first amplification section and the signal whose impedance is inverted by the impedance inverting circuit, and combines and outputs these signals. The combining circuit includes a line which is ($\lambda/4$)+$\gamma$ in length and which is an asymmetrical circuit element and a line which is ($\lambda/4$)−$\delta$ in length and which is an asymmetrical circuit element.

8 Claims, 20 Drawing Sheets

AMPLIFICATION APPARATUS

CROSS-REFERENCE TO RELATED APPLICATION

This application is based upon and claims the benefit of priority of the prior Japanese Patent Application No. 2012-047505, filed on Mar. 5, 2012, the entire contents of which are incorporated herein by reference.

FIELD

The embodiments discussed herein are related to an amplification apparatus.

BACKGROUND

Constant envelope amplification apparatus (also referred to as outphasing amplification apparatus) have traditionally been known. In order to improve efficiency, a constant envelope amplification apparatus generates two constant amplitude signals from an input signal by vector decomposition and amplifies the two constant amplitude signals.

A linear constant envelope amplification apparatus which performs lossy combination of two amplified signals (vectors) by the use of a resistance element or a highly efficient constant envelope amplification apparatus which performs lossless combination of two amplified signals (vectors) without using a resistance element is known as a constant envelope amplification apparatus. Highly efficient constant envelope amplification apparatus are of two types according to the structure of an output combining circuit: offset type and Chireix type.

A highly efficient, highly linear power amplification apparatus using a 4-terminal power combining circuit the loss of which is reduced was provided in the past (see, for example, Japanese Laid-open Patent Publication No. 2000-349575).

With constant envelope amplification apparatus, however, higher efficiency and a flat phase characteristic in an amplification band are required.

SUMMARY

According to an aspect, there is provided an amplification apparatus for generating two constant amplitude signals from an input signal by vector decomposition and amplifying the two constant amplitude signals, including a first amplification section which amplifies a first signal obtained by the vector decomposition, a second amplification section which amplifies a second signal obtained by the vector decomposition, an impedance inverting circuit which inverts impedance of the second signal amplified by the second amplification section, and a combining circuit which corrects a phase of the first signal amplified by the first amplification section and a phase of the second signal whose impedance is inverted by the impedance inverting circuit and which combines and outputs the first signal and the second signal, the combining circuit including asymmetrical circuit elements or the asymmetrical circuit elements being inserted between the first amplification section or the second amplification section and the combining circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
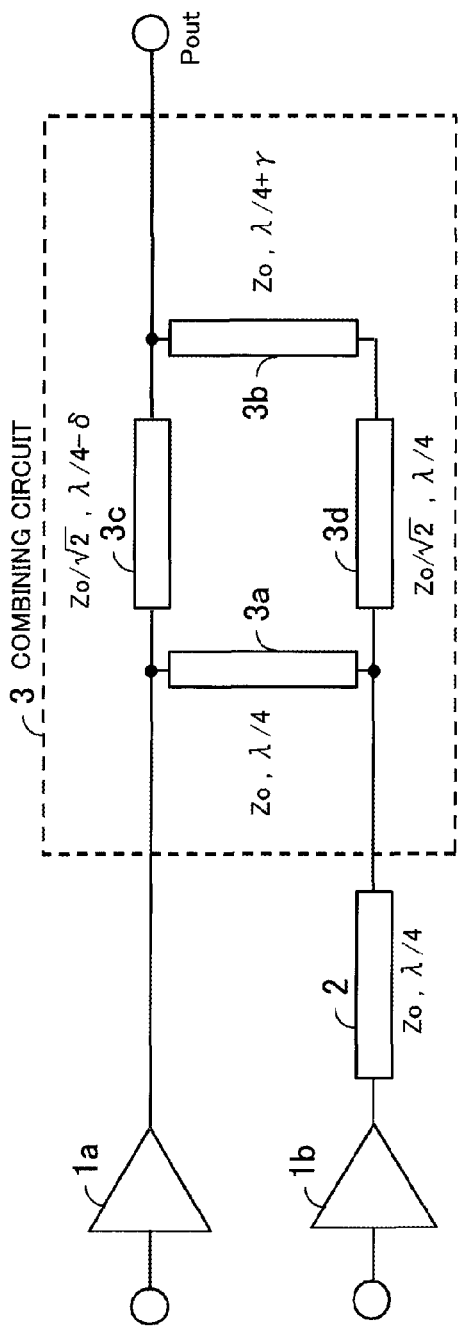
FIG. 1 is a view for describing an amplification apparatus according to a first embodiment.
Figure 1:
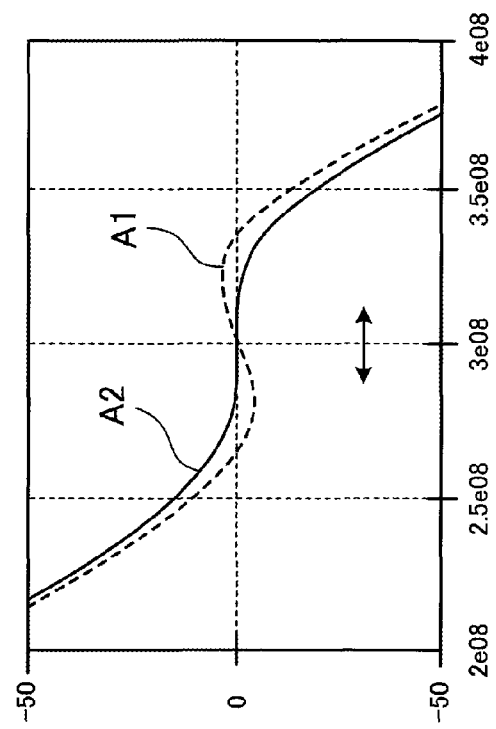

Embodiments will now be described in detail with reference to the accompanying drawings, wherein like reference numerals refer to like elements throughout.

First Embodiment

FIG. 1 is a view for describing an amplification apparatus according to a first embodiment. As illustrated in FIG. 1, an amplification apparatus includes amplification sections 1a and 1b, an impedance inverting circuit 2, and a combining circuit 3.

The phase characteristic of the amplification apparatus is indicated under the amplification apparatus illustrated in FIG. 1. In FIG. 1, a horizontal axis indicates a frequency and a vertical axis indicates the difference in phase at an output terminal Pout between a signal outputted from the amplification section 1a and a signal outputted from the amplification section 1b. A two-way arrow on the graph indicative of the phase characteristic indicates a signal amplification band.

The amplification apparatus generates two constant amplitude signals by vector decomposition from an input signal to be amplified and outputted. One signal obtained by the vector decomposition is inputted to the amplification section 1a and the other signal obtained by the vector decomposition is inputted to the amplification section 1b. The amplification sections 1a and 1b amplify the signals obtained by the vector decomposition.

The impedance inverting circuit 2 inverts the impedance of the signal amplified by the amplification section 1b. The impedance inverting circuit 2 adjusts the phases of a signal flowing from the amplification section 1a toward the amplification section 1b and a signal reflected from the amplification section 1b itself so that the efficiency of the operation of the amplification sections 1a and 1b will be high. For example, the impedance inverting circuit 2 is a line with a characteristic impedance of Zo and a length of $\lambda/4$. Zo is load impedance at the output terminal Pout. $\lambda$ is a wavelength at a center frequency of the signal to be amplified.

The combining circuit 3 corrects phases of the signal amplified by the amplification section 1a and the signal whose impedance is inverted by the impedance inverting circuit 2, and combines and outputs these signals. As illustrated in FIG. 1, for example, the combining circuit 3 is a branch-line combining circuit in which lines 3a through 3d are arranged like a tetragon. The combining circuit 3 includes asymmetrical circuit elements. By doing so, a difference in phase which arises between the two signals (signals outputted from the amplification sections 1a and 1b) at the output terminal Pout as a result of the insertion of the impedance inverting circuit 2 is controlled.

It is assumed that the combining circuit 3 is a 90-degree branch-line combining circuit. In this case, the characteristic impedance of the lines 3a and 3b is Zo and the characteristic impedance of the lines 3c and 3d is Zo/$\sqrt{2}$. In addition, the length of the lines 3a through 3d is $\lambda/4$ (90 degrees). If the combining circuit 3 is a 90-degree branch-line combining circuit, a difference in phase arises at the output terminal Pout between the signals outputted from the amplification sections 1a and 1b as a result of the insertion of the impedance inverting circuit 2, and the phase characteristic is not flat in the amplification band.

For example, a waveform A1 in FIG. 1 indicates the phase characteristic at the output terminal Pout obtained in the case of the combining circuit 3 being a 90-degree branch-line combining circuit. As indicated by the waveform A1, if the combining circuit 3 is a 90-degree branch-line combining circuit, a difference in phase arises between the two signals in the amplification band (indicated by the two-way arrow in FIG. 1) and the phase characteristic is not flat.

On the other hand, the combining circuit 3 includes asymmetrical circuit elements. The combining circuit 3 including asymmetrical circuit elements is, for example, a combining circuit including the two lines 3b and 3c which are coupled to the output terminal Pout and which are not $\lambda/4$ in length.

To be concrete, it is assumed that the lines 3a and 3d are $\lambda/4$ in length, that the line 3b is $(\lambda/4)+\gamma$ in length, and that the line 3c is $(\lambda/4)-\delta$ in length. In this case, the combining circuit 3 includes asymmetrical circuit elements and the lines 3b and 3c are asymmetrical circuit elements. The combining circuit 3 includes asymmetrical circuit elements. By doing so, a difference in phase which arises between the two signals at the output terminal Pout as a result of the insertion of the impedance inverting circuit 2 is controlled and the phase characteristic becomes flat in the amplification band.

For example, a waveform A2 in FIG. 1 indicates the phase characteristic at the output terminal Pout obtained in the case of the combining circuit 3 including asymmetrical circuit elements. As indicated by the waveform A2, if the combining circuit 3 includes asymmetrical circuit elements, the difference in phase between the two signals is 0 in the amplification band and the phase characteristic is flat.

That is to say, if the combining circuit 3 included in the amplification apparatus is a 90-degree branch-line combining circuit, a difference in signal path (difference between a path from the amplification section 1a to the output terminal Pout and a path from the amplification section 1b to the output terminal Pout) arises as a result of the insertion of the impedance inverting circuit 2 and a difference in phase arises between the two signals at the output terminal Pout.

On the other hand, the combining circuit 3 includes the line 3b and the line 3c which are $(\lambda/4)+\gamma$ and $(\lambda/4)-\delta$, respectively, in length and which are asymmetrical circuit elements. By doing so, a difference in phase due to a difference in signal path which arises as a result of the insertion of the impedance inverting circuit 2 is controlled.

As described later, if the combining circuit 3 includes asymmetrical circuit elements, the efficiency of the amplification apparatus can be increased further.

Furthermore, in the above description the combining circuit 3 includes asymmetrical circuit elements. However, asymmetrical circuit elements may be inserted between the amplification section 1a or 1b and the combining circuit 3. For example, an open stub with a length of x is coupled to the output side of the amplification section 1a. In addition, an open stub with a length of y different from x is coupled to the output side of the amplification section 1b. In this case, the open stubs which are coupled to the output sides of the amplification sections 1a and 1b and which differ in length are asymmetrical circuit elements. By using these open stubs, the amplification apparatus can also realize high efficiency and a flat phase characteristic in the amplification band. This is the same with the above case.

Furthermore, the length of lines, which are asymmetrical circuit elements, is designed so that, as indicated by the waveform A2, a difference in phase will be 0 in the amplification band and so that the phase characteristic will be flat in the amplification band.

As has been described, the amplification apparatus includes the impedance inverting circuit 2 on the output side of one of the two amplification sections 1a and 1b. The combining circuit 3 includes asymmetrical circuit elements or asymmetrical circuit elements are inserted between the amplification section 1a or 1b and the combining circuit 3. This makes it possible to increase the efficiency of the amplification apparatus by the impedance inverting circuit 2 and to make its phase characteristic flat and further increase its efficiency by the combining circuit 3 which performs phase correction and combination and which includes asymmetrical circuit elements or by asymmetrical circuit elements inserted between the amplification section 1a or 1b and the combining circuit 3.

Second Embodiment

A second embodiment will now be described in detail with reference to the accompanying drawings.

Figure 2:
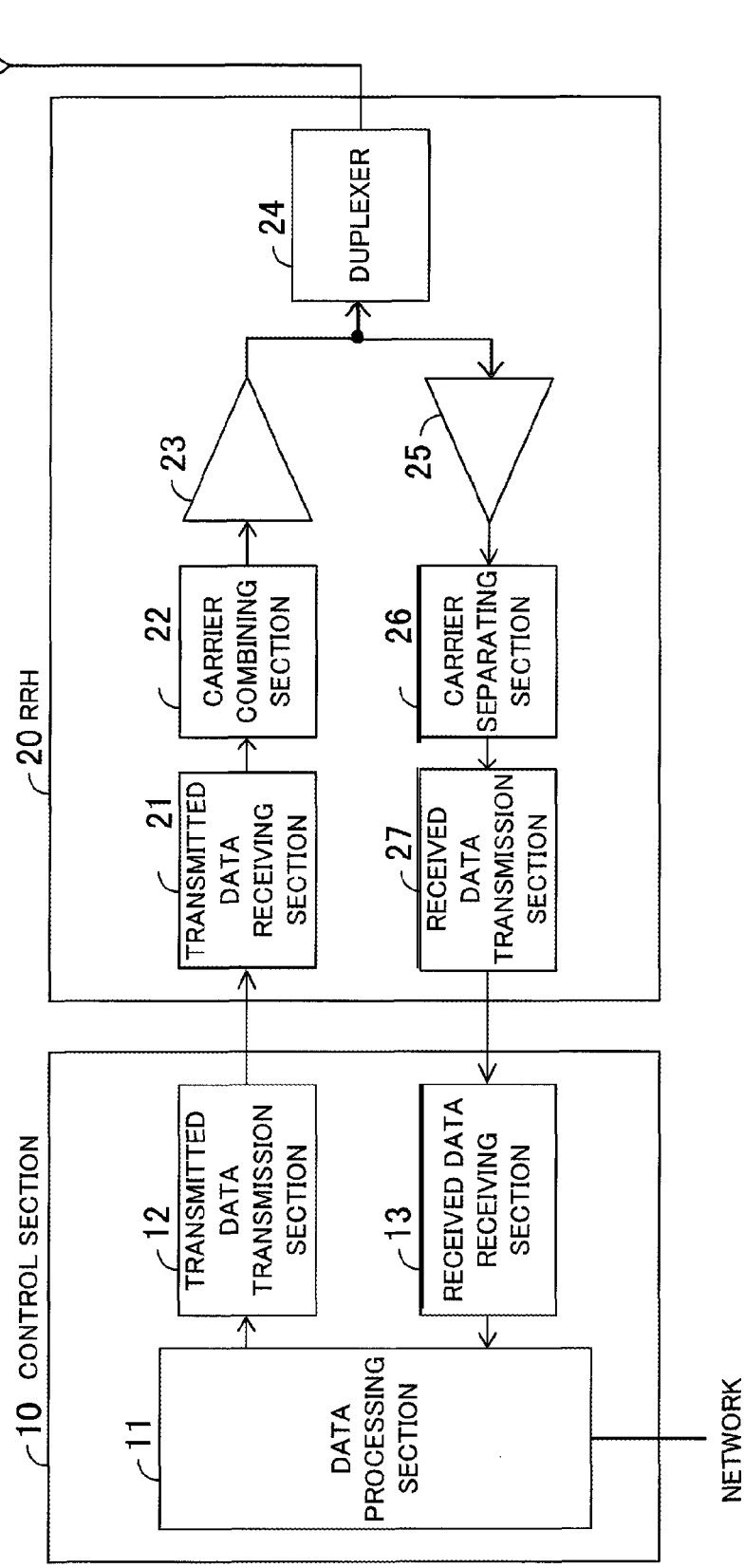
FIG. 2 is a block diagram of a base station including an amplification apparatus according to a second embodiment.

FIG. 2 is a block diagram of a base station including an amplification apparatus according to a second embodiment. As illustrated in FIG. 2, a base station includes a controller 10 and an RRH (Remote Radio Head) 20. The controller 10 and the RRH 20 are coupled by, for example, an optical fiber. The base station performs radio communication with, for example, a radio terminal, such as a portable telephone, (not illustrated).

The controller 10 includes a data processing section 11, a transmitted data transmission section 12, and a received data receiving section 13.

The data processing section 11 is coupled to a network. The data processing section 11 receives data to be radio-transmitted to a radio terminal from an upper apparatus coupled to the network. The data processing section 11 outputs the received data to the transmitted data transmission section 12. In addition, the data processing section 11 transmits data which is received from a radio terminal and which is to be outputted from the received data receiving section 13 to the upper apparatus coupled to the network. The data processing section 11 is, for example, a DSP (Digital Signal Processor) or an FPGA (Field Programmable Gate Array).

The transmitted data transmission section 12 E/O (Electrical signal/Optical signal)-converts data outputted from the data processing section 11. The transmitted data transmission section 12 transmits the E/O-converted data to the RRH 20 via the optical fiber.

The received data receiving section 13 O/E (Optical signal/Electrical signal)-converts data received from the RRH 20 via the optical fiber. The received data receiving section 13 outputs the O/E converted data to the data processing section 11.

The RRH 20 includes a transmitted data receiving section 21, a carrier combining section 22, amplification apparatus 23 and 25, a duplexer 24, a carrier separating section 26, and a received data transmission section 27.

The transmitted data receiving section 21 receives an optical signal transmitted from the transmitted data transmission section 12 of the controller and O/E-converts it. The transmitted data receiving section 21 outputs O/E-converted data to the carrier combining section 22.

The carrier combining section 22 assigns data outputted from the transmitted data receiving section 21 to a plurality of frequencies. The carrier combining section 22 combines the data assigned to the plurality of frequencies into one signal and outputs it to the amplification apparatus 23.

The amplification apparatus 23 amplifies a signal outputted from the carrier combining section 22, and outputs the signal to the duplexer 24. The amplification apparatus 23 generates two constant amplitude signals from the input signal by vector decomposition and amplifies these two signals. The amplification apparatus 23 combines the two amplified signals into one signal and outputs it to the duplexer 24. The amplification apparatus 23 corresponds to, for example, the amplification apparatus illustrated in FIG. 1.

The duplexer 24 outputs to an antenna a radio signal which is outputted from the amplification apparatus 23 and which is to be transmitted to a radio terminal. In addition, the duplexer 24 outputs a signal received from a radio terminal by the antenna to the amplification apparatus 25.

The amplification apparatus 25 amplifies a signal outputted from the duplexer 24 and outputs it to the carrier separating section 26.

The carrier separating section 26 demodulates data assigned to a plurality of frequencies according to frequencies and outputs the data to the received data transmission section 27.

The received data transmission section 27 E/O-converts data outputted from the carrier separating section 26 and outputs the data to the received data receiving section 13 of the controller 10.

Figure 3:
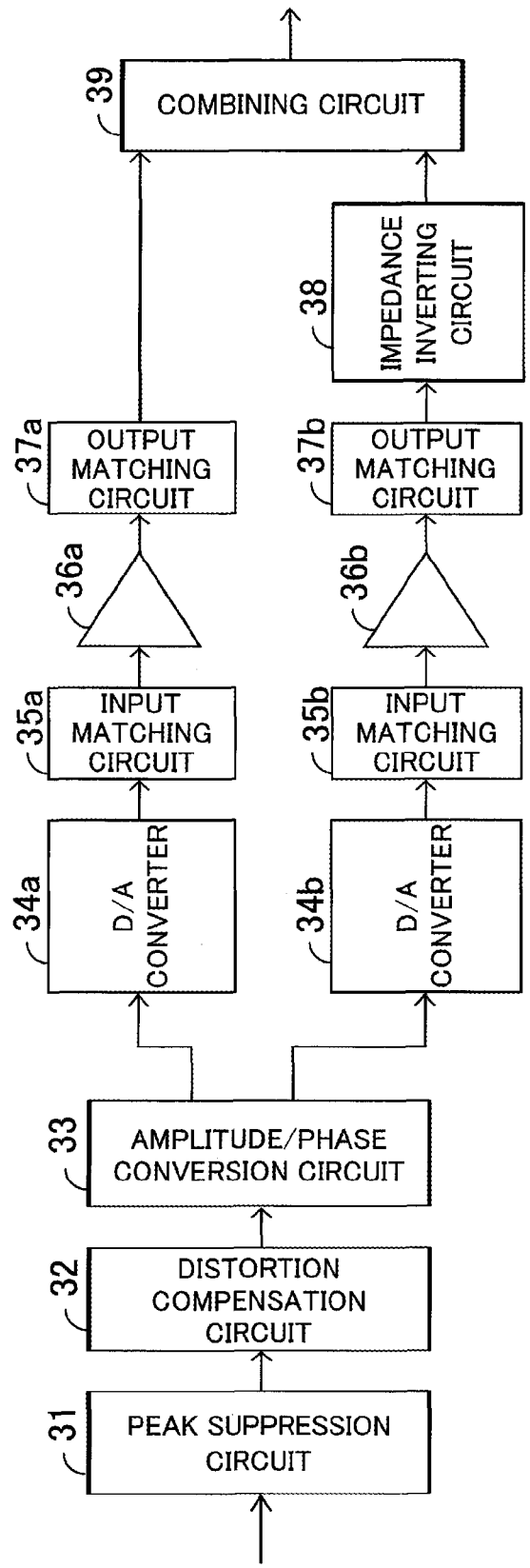
FIG. 3 is a block diagram of an amplification apparatus.

FIG. 3 is a block diagram of the amplification apparatus. As illustrated in FIG. 3, the amplification apparatus 23 includes a peak suppression circuit 31, a distortion compensation circuit 32, an amplitude/phase conversion circuit 33, D/A (Digital to Analog) converters 34a and 34b, input matching circuits 35a and 35b, amplifiers 36a and 36b, output matching circuits 37a and 37b, an impedance inverting circuit 38, and a combining circuit 39.

A signal outputted from the carrier combining section 22 is inputted to the peak suppression circuit 31. If the amplitude of the input signal exceeds a determined threshold, the peak suppression circuit 31 suppresses the amplitude in order to control a distortion component of a signal to be amplified by the amplifier 36a or 36b.

In order to control a distortion component of a signal to be amplified by the amplifier 36a or 36b, the distortion compensation circuit 32 exercises distortion compensation control. For example, the distortion compensation circuit 32 calculates a distortion compensation coefficient on the basis of an input signal and a signal (feedback signal) amplified by the amplifier 36a or 36b. The distortion compensation circuit 32 multiplies the input signal by a calculated distortion compensation coefficient to compensate for distortion of the signal amplified by the amplifier 36a or 36b.

The amplitude/phase conversion circuit 33 generates two constant amplitude signals from a signal outputted from the distortion compensation circuit 32 by vector decomposition.

Figure 4:
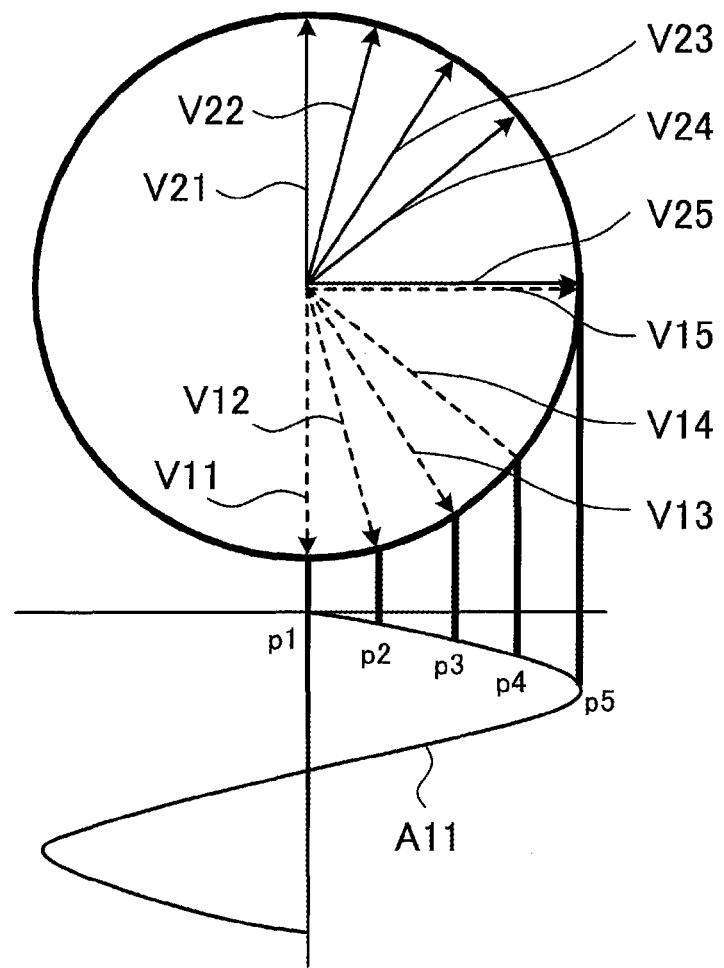
FIG. 4 is a view for describing an amplitude/phase conversion circuit.

FIG. 4 is a view for describing the amplitude/phase conversion circuit. A waveform A11 illustrated in FIG. 4 indicates a signal inputted to the amplitude/phase conversion circuit 33.

The amplitude/phase conversion circuit 33 decomposes a signal at a point p1 on the waveform A11 into two vector signals V11 and V21 each having the same amplitude. Similarly, the amplitude/phase conversion circuit 33 decomposes signals at points p2 through p5 on the waveform A11 into two vector signals V12 and V22, V13 and V23, V14 and V24, and V15 and V25, respectively, each having the same amplitude.

By combining the two vector signals V12 and V22, V13 and V23, V14 and V24, and V15 and V25 after the decomposition, the input signal indicated by the waveform A11 can be restored.

Furthermore, when the amplitude of the signal indicated by the waveform A11 is 0, the amplitude/phase conversion circuit 33 makes the phases of vector signals after decomposition reverse to each other.

The following is a continuation of the description of FIG. 3. The D/A converter 34a converts one signal which the amplitude/phase conversion circuit 33 generates by vector decomposition to an analog signal. The D/A converter 34b converts the other signal which the amplitude/phase conversion circuit 33 generates by vector decomposition to an analog signal.

The input matching circuit 35a makes the output impedance of the D/A converter 34a match the input impedance of the amplifier 36a. The input matching circuit 35b makes the output impedance of the D/A converter 34b match the input impedance of the amplifier 36b.

The amplifier 36a amplifies a signal outputted from the D/A converter 34a. The amplifier 36b amplifies a signal outputted from the D/A converter 34b. Each of the amplifiers 36a and 36b includes a transistor using an LDMOS (Laterally Diffused Metal Oxide Semiconductor), GaN, GaAs, or the like.

The output matching circuit 37a makes the output impedance of the amplifier 36a match the input impedance of the combining circuit 39. The output matching circuit 37b makes the output impedance of the amplifier 36b match the input impedance of the combining circuit 39.

The impedance inverting circuit 38 inverts the impedance of a signal outputted from the output matching circuit 37b. For example, the impedance inverting circuit 38 maintains the amplitude of a signal outputted from the output matching circuit 37b and inverts its phase.

The combining circuit 39 combines signals outputted from the output matching circuits 37a and 37b. As a result, a signal obtained by amplifying a signal inputted to the amplitude/phase conversion circuit 33 is outputted from the combining circuit 39.

The amplifiers 36a and 36b illustrated in FIG. 3 correspond to, for example, the amplification sections 1a and 1b illustrated in FIG. 1. The impedance inverting circuit 38 corresponds to, for example, the impedance inverting circuit 2 illustrated in FIG. 1. The combining circuit 39 corresponds to, for example, the combining circuit 3 illustrated in FIG. 1.

An offset combining circuit and a Chireix combining circuit will be described before the combining circuit 39 illustrated in FIG. 3 is described.

Figure 5:
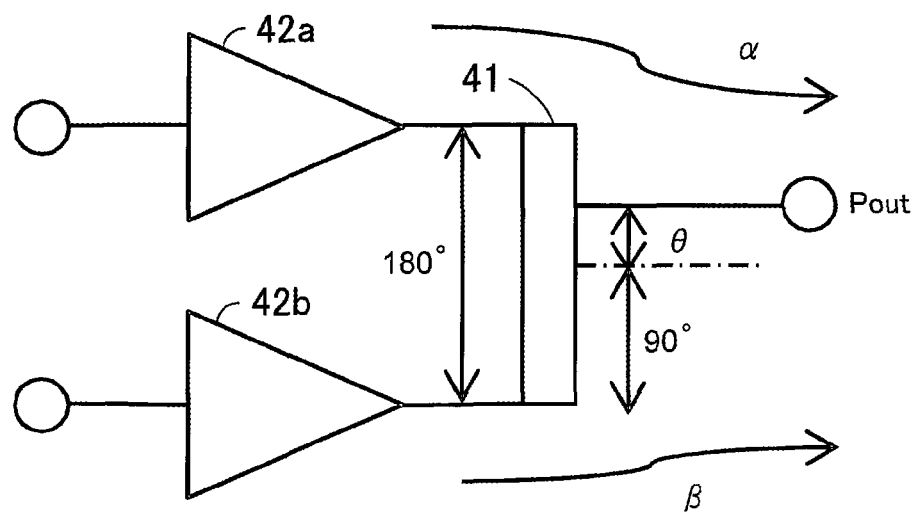
FIG. 5 illustrates an offset combining circuit.

FIG. 5 illustrates an offset combining circuit. As illustrated in FIG. 5, an offset combining circuit is a line 41 with a length of λ/2 (180°). With the offset combining circuit an output terminal Pout is located at a position θ distant from the middle (λ/4, or 90°) of the line 41. λ is a wavelength at a center frequency of a signal to be amplified.

FIG. 5 also illustrates amplifiers 42a and 42b which amplify two signals after vector decomposition. Signals outputted from the amplifiers 42a and 42b are combined by the line 41 and are outputted from the output terminal Pout.

Figure 6:
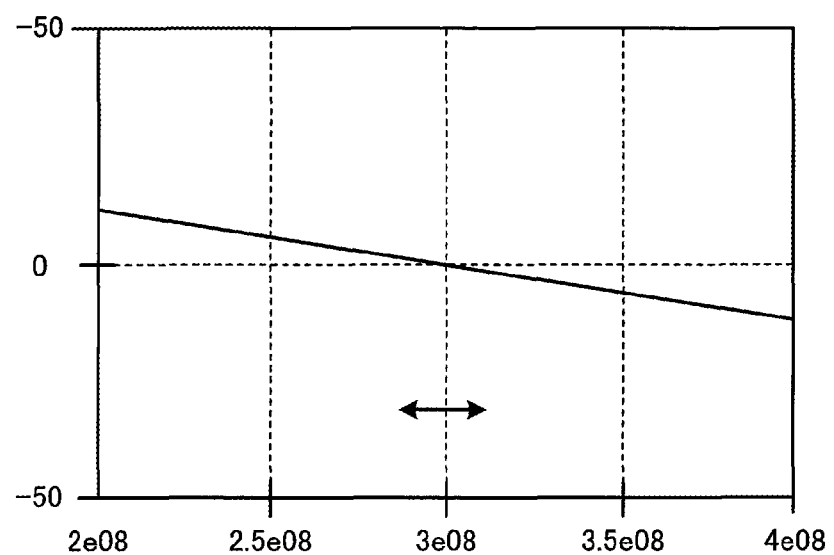
FIG. 6 indicates the phase characteristic of the combining circuit illustrated in FIG. 5.

FIG. 6 indicates the phase characteristic of the combining circuit illustrated in FIG. 5. In FIG. 6, a horizontal axis indicates a frequency and a vertical axis indicates the difference in phase between a signal which flows along a path α indicated in FIG. 5 and a signal which flows along a path β indicated in FIG. 5.

With the offset combining circuit, as described in FIG. 5, the output terminal Pout is located at the position θ distant from the middle of the line 41. As a result, the power efficiency of an amplification apparatus improves. However, there is a difference in length between the path from the output side of the amplifier 42a to the output terminal Pout and the path from the output side of the amplifier 42b to the output terminal Pout. Accordingly, even if a difference in phase is set to 0 at the center frequency of an amplification band, a difference in phase arises at a frequency distant from the center frequency.

For example, a two-way arrow in FIG. 6 indicates a signal amplification band. With the offset combining circuit, as indicated in FIG. 6, a frequency-phase deviation arises in the amplification band.

Figure 7:
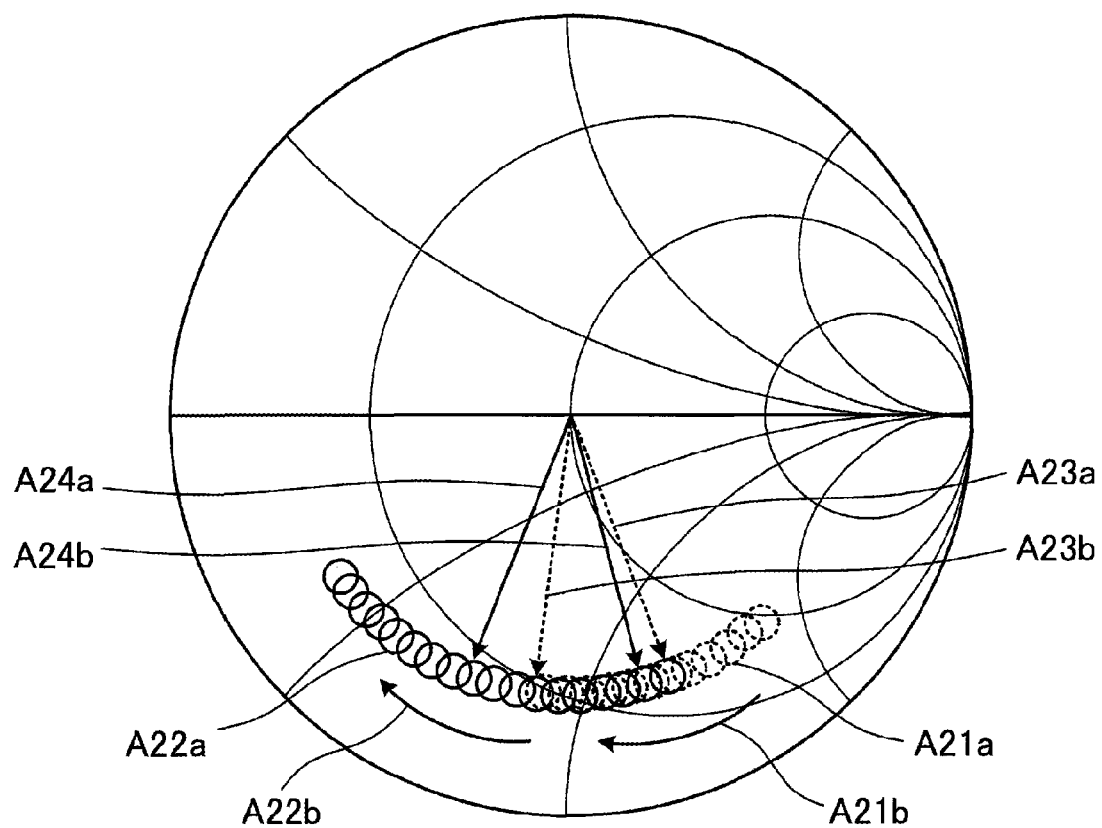
FIG. 7 is a view for describing a frequency-phase deviation of the combining circuit illustrated in FIG. 5.

FIG. 7 is a view for describing the frequency-phase deviation of the combining circuit illustrated in FIG. 5. FIG. 7 is a Smith chart.

Dashed-line circles A21a in FIG. 7 indicate a change in the phase of a signal which flows along the path α indicated in FIG. 5. As the frequency increases, the phase of a signal which flows along the path α changes in a manner indicated by an arrow A21b.

Solid-line circles A22a in FIG. 7 indicate a change in the phase of a signal which flows along the path β indicated in FIG. 5. As the frequency increases, the phase of a signal which flows along the path β changes in a manner indicated by an arrow A22b.

When the frequency is changed in the amplification band, the phase of a signal which flows along the path α changes in a manner indicated by arrows A23a and A23b in FIG. 7. When the frequency is changed in the amplification band, the phase of a signal which flows along the path β changes in a manner indicated by arrows A24a and A24b in FIG. 7.

With the combining circuit illustrated in FIG. 5, there is a difference in length between the path from the output side of the amplifier 42a to the output terminal Pout and the path from the output side of the amplifier 42b to the output terminal Pout. As a result, a change in phase on the path α indicated by the arrows A23a and A23b and a change in phase on the path β indicated by the arrows A24a and A24b differ. Accordingly, as can be seen from the phase characteristic indicated in FIG. 6, even if the combining circuit is designed so that a difference in phase will be 0 at the center frequency, a difference in phase arises at a frequency distant from the center frequency. That is to say, with the offset combining circuit illustrated in FIG. 5, it is difficult to make the phase characteristic flat in the amplification band.

A Chireix combining circuit will be described.

Figure 8:
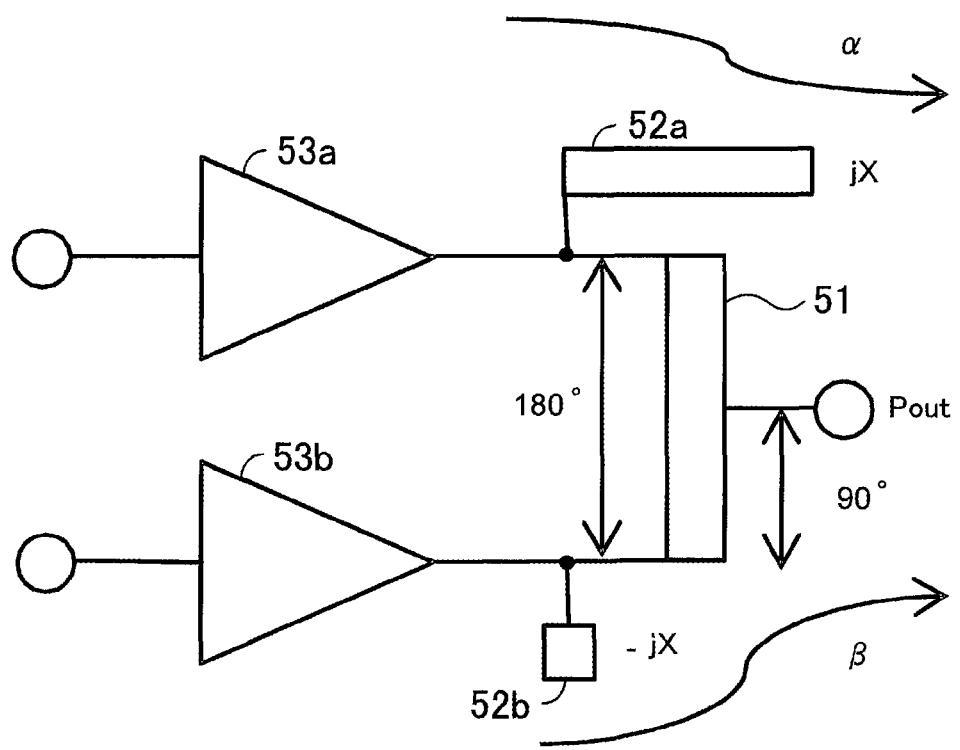
FIG. 8 illustrates a Chireix combining circuit.

FIG. 8 illustrates a Chireix combining circuit. As illustrated in FIG. 8, a Chireix combining circuit includes a line 51 with a length of λ/2 (180°) and open stubs 52a and 52b having reactances of jX and −jX respectively. With the Chireix combining circuit an output terminal Pout is located at the middle (λ/4, or 90°) of the line 51.

FIG. 8 also illustrates amplifiers 53a and 53b which amplify two signals after vector decomposition. The open stub 52a is coupled in parallel with an output line of the amplifier 53a. The open stub 52b is coupled in parallel with an output line of the amplifier 53b. Signals outputted from the amplifiers 53a and 53b are combined by the line 51 and are outputted from the output terminal Pout.

Figure 9:
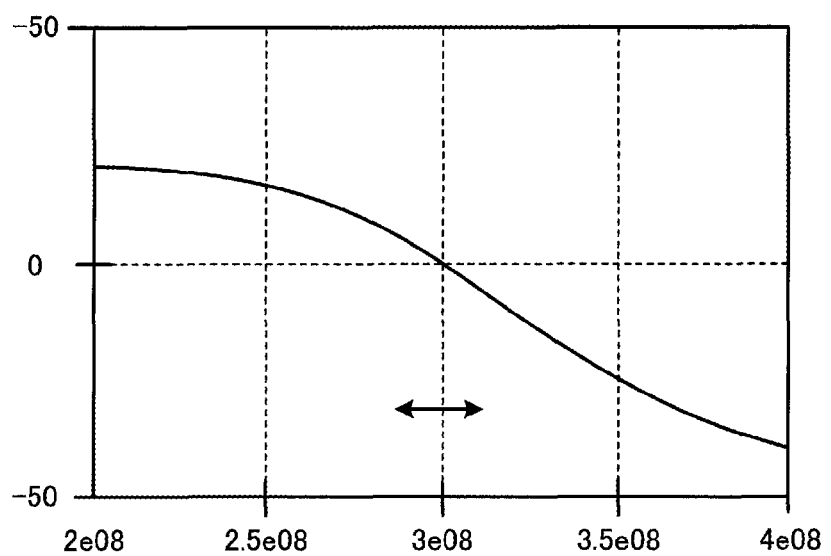
FIG. 9 indicates the phase characteristic of the combining circuit illustrated in FIG. 8.

FIG. 9 indicates the phase characteristic of the combining circuit illustrated in FIG. 8. In FIG. 9, a horizontal axis indicates a frequency and a vertical axis indicates the difference in phase between a signal which flows along a path α indicated in FIG. 8 and a signal which flows along a path β indicated in FIG. 8.

With the Chireix combining circuit, as described in FIG. 8, the open stub 52a having a reactance of jX is coupled in parallel with the output line of the amplifier 53a and the open stub 52b having a reactance of −jX is coupled in parallel with the output line of the amplifier 53b. As a result, a difference in phase arises between a signal which flows along the path α and a signal which flows along the path β. Accordingly, a frequency-phase deviation arises in an amplification band indicated in FIG. 9 by a two-way arrow.

Figure 10:
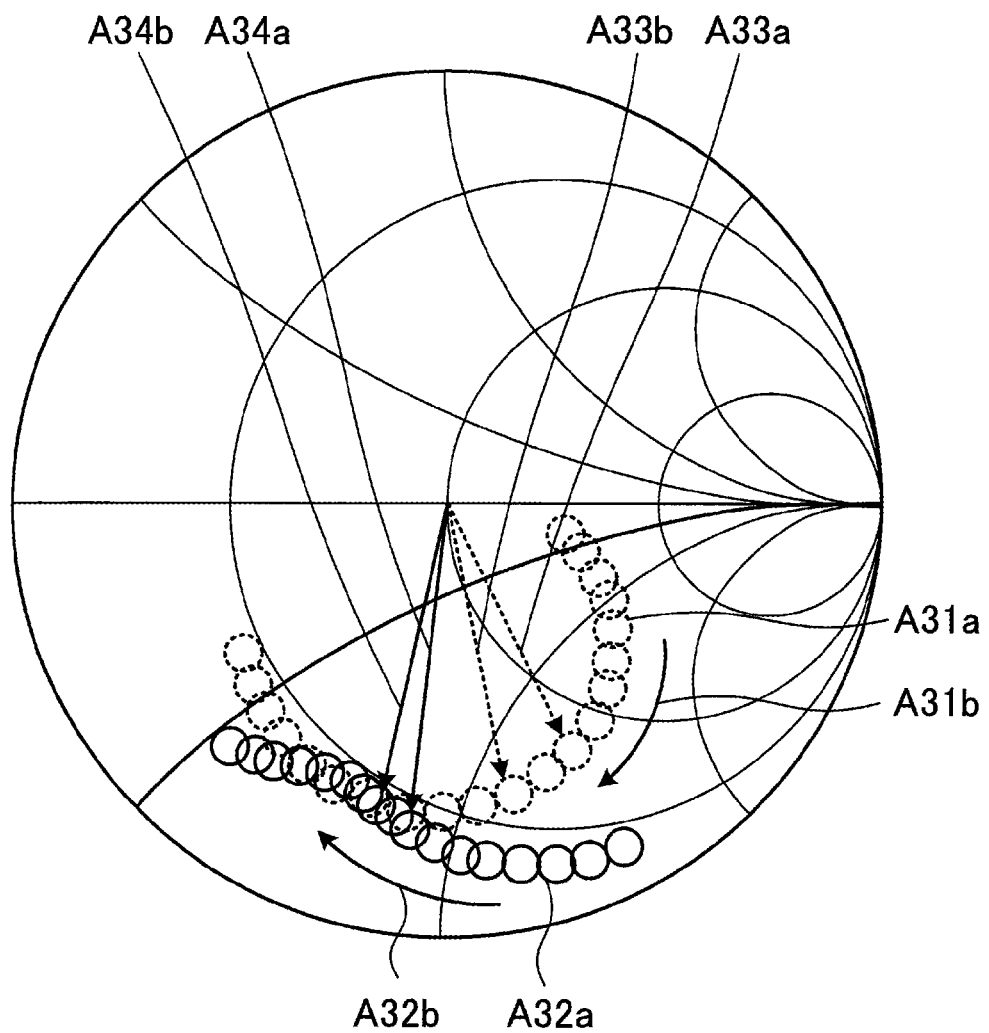
FIG. 10 is a view for describing a frequency-phase deviation of the combining circuit illustrated in FIG. 8.

FIG. 10 is a view for describing the frequency-phase deviation of the combining circuit illustrated in FIG. 8. FIG. 10 is a Smith chart.

Dashed-line circles A31a in FIG. 10 indicate a change in the phase of a signal which flows along the path α indicated in FIG. 8. As the frequency increases, the phase of a signal which flows along the path α changes in a manner indicated by an arrow A31b.

Solid-line circles A32a in FIG. 10 indicate a change in the phase of a signal which flows along the path β indicated in FIG. 8. As the frequency increases, the phase of a signal which flows along the path β changes in a manner indicated by an arrow A32b.

When the frequency is changed in the amplification band, the phase of a signal which flows along the path α changes in a manner indicated by arrows A33a and A33b in FIG. 10. When the frequency is changed in the amplification band, the phase of a signal which flows along the path β changes in a manner indicated by arrows A34a and A34b in FIG. 10.

With the combining circuit illustrated in FIG. 8, the open stubs 52a and 52b having reactances of jX and −jX are coupled to the output sides of the amplifiers 53a and 53b, respectively. As a result, a change in phase on the path α indicated by the arrows A33a and A33b and a change in phase on the path β indicated by the arrows A34a and A34b differ. Accordingly, as can be seen from the phase characteristic indicated in FIG. 9, even if the combining circuit is designed so that a difference in phase will be 0 at the center frequency, a difference in phase arises at a frequency distant from the center frequency. That is to say, with the Chireix combining circuit illustrated in FIG. 8, it is difficult to make the phase characteristic flat in the amplification band.

The combining circuit 39 illustrated in FIG. 3 will be described.

Figure 11:
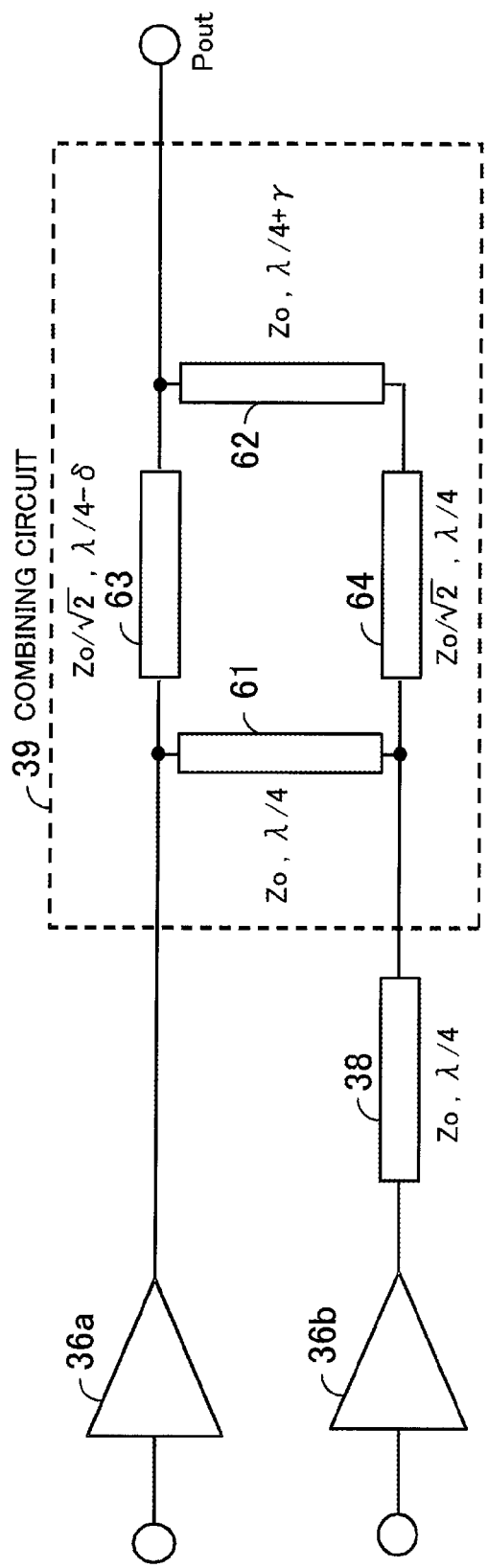
FIG. 11 illustrates the combining circuit of FIG. 3.

FIG. 11 illustrates the combining circuit of FIG. 3. Components in FIG. 11 which are the same as those illustrated in FIG. 3 are marked with the same numerals. FIG. 11 illustrates the amplifiers 36a and 36b and the impedance inverting circuit 38 in addition to the combining circuit 39. In FIG. 11, the output matching circuits 37a and 37b illustrated in FIG. 3 are not illustrated.

As illustrated in FIG. 11, the combining circuit 39 includes lines 61 through 64. The lines 61 and 62 are coupled in parallel to the output sides of the amplifiers 36a and 36b with the lines 63 and 64 therebetween. The lines 63 and 64 are coupled in series between the lines 61 and 62. The combining circuit 39 is a branch-line combining circuit and the lines 61 through 64 are arranged like a tetragon and are coupled. An output terminal Pout is coupled at a point at which the lines 62 and 63 are coupled.

The line 61 has a characteristic impedance of Zo. In addition, the line 61 has a length of $\lambda/4$. Zo is load impedance at the output terminal Pout. $\lambda$ is a wavelength at a center frequency of a signal to be amplified.

The line 62 has a characteristic impedance of Zo. In addition, the line 62 has a length of $(\lambda/4)+\gamma$. The line 62 is more than $\lambda/4$ in thickness and is an asymmetrical circuit element.

The line 63 has a characteristic impedance of $Zo/\sqrt{2}$. In addition, the line 63 has a length of $(\lambda/4)-\delta$. The line 63 is less than $\lambda/4$ in thickness and is an asymmetrical circuit element.

The line 64 has a characteristic impedance of $Zo/\sqrt{2}$. In addition, the line 64 has a length of $\lambda/4$.

The impedance inverting circuit 38 is a line having a characteristic impedance of Zo and a length of $\lambda/4$.

Figure 12:
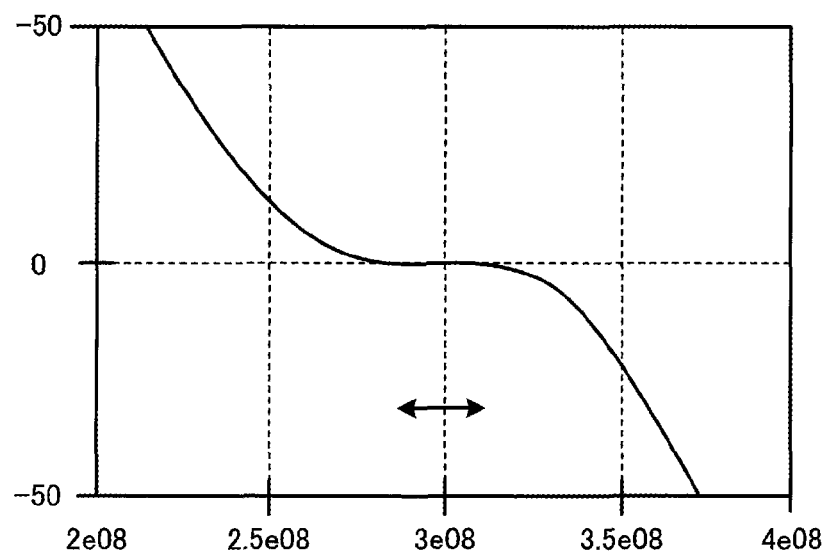
FIG. 12 indicates the phase characteristic of the combining circuit illustrated in FIG. 11.

FIG. 12 indicates the phase characteristic of the combining circuit illustrated in FIG. 11. In FIG. 12, a horizontal axis indicates a frequency and a vertical axis indicates the difference in phase between a signal which flows from the amplifier 36a to the output terminal Pout illustrated in FIG. 11 and a signal which flows from the amplifier 36b to the output terminal Pout illustrated in FIG. 11.

As described in FIG. 11, the impedance inverting circuit 38 is coupled to the output side of the amplifier 36b. The impedance inverting circuit 38 adjusts the phases of a signal flowing from the amplifier 36a toward the amplifier 36b and a signal reflected from the amplifier 36b itself so that the efficiency of the operation of the amplifiers 36a and 36b will be high.

It is assumed that the combining circuit 39 illustrated in FIG. 11 is a 90-degree branch-line combining circuit. In this case, a difference in phase arises at the output terminal Pout between signals outputted from the amplifiers 36a and 36b because of a difference in signal path which arises from the use of the impedance inverting circuit 38.

On the other hand, the combining circuit 39 includes the lines 62 and 63 which are asymmetrical circuit elements. As a result, a difference in phase due to a difference in signal path which arises from the insertion of the impedance inverting circuit 38 is controlled.

That is to say, with the amplification apparatus high efficiency is realized by the impedance inverting circuit 38. In addition, as indicated by a two-way arrow in FIG. 12, with the amplification apparatus the phase characteristic can be made flat in an amplification band. Furthermore, as described later, the combining circuit 39 includes asymmetrical circuit elements, so higher efficiency can be realized.

$\gamma$ and $\delta$ included in the lengths of the lines 62 and 63 are designed so that a difference in phase will be 0 in the amplification band of the phase characteristic indicated in FIG. 12.

Figure 13:
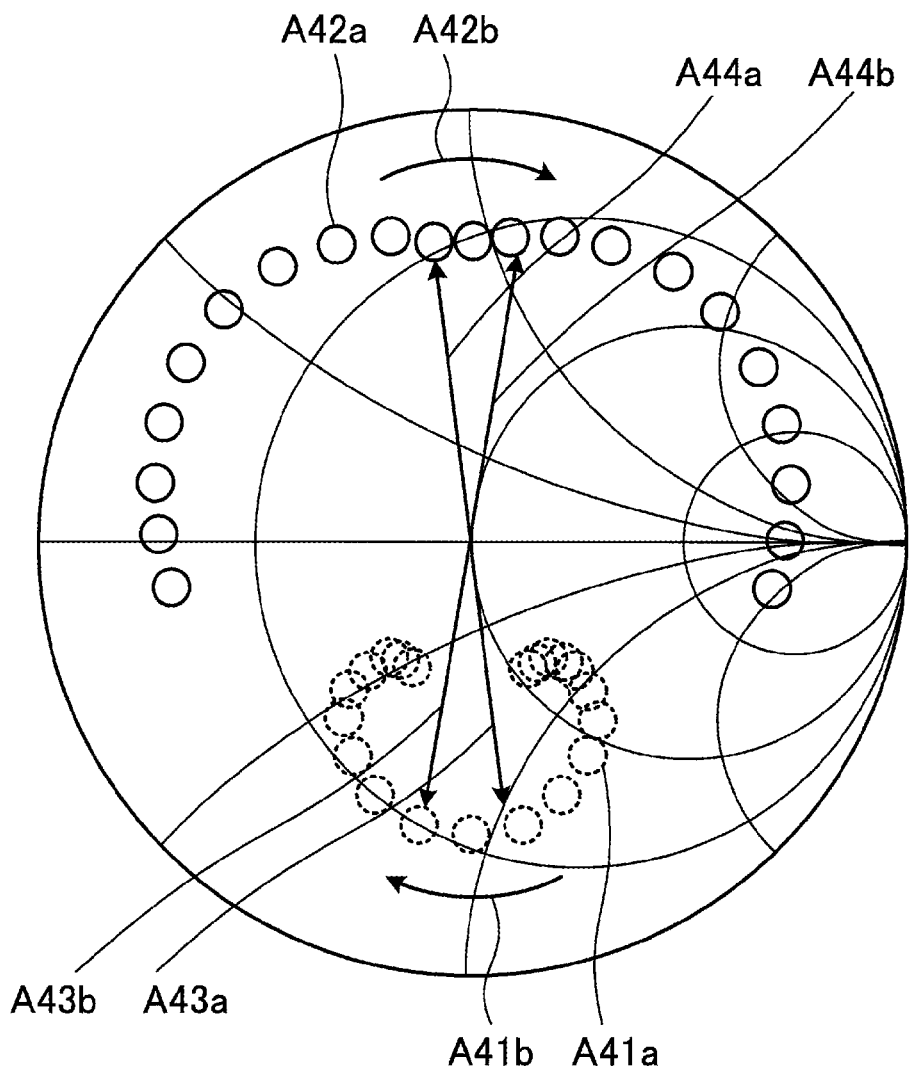
FIG. 13 is a view for describing a frequency-phase deviation of the combining circuit illustrated in FIG. 11.

FIG. 13 is a view for describing a frequency-phase deviation of the combining circuit illustrated in FIG. 11. FIG. 13 is a Smith chart.

Dashed-line circles A41a in FIG. 13 indicate a change in the phase at the output terminal Pout of a signal outputted from the amplifier 36a illustrated in FIG. 11. As the frequency increases, the phase of a signal outputted from the amplifier 36a changes in a manner indicated by an arrow A41b.

Solid-line circles A42a in FIG. 13 indicate a change in the phase at the output terminal Pout of a signal outputted from the amplifier 36b illustrated in FIG. 11. As the frequency increases, the phase of a signal outputted from the amplifier 36b changes in a manner indicated by an arrow A42b.

When the frequency is changed in the amplification band, the phase of a signal outputted from the amplifier 36a changes in a manner indicated by arrows A43a and A43b in FIG. 13. When the frequency is changed in the amplification band, the phase of a signal outputted from the amplifier 36b changes in a manner indicated by arrows A44a and A44b in FIG. 13.

An angle between the arrows A43a and A43b and an angle between the arrows A44a and A44b are the same. That is to say, the phases of signals outputted from the amplifiers 36a and 36b change in the same manner with a change in frequency in the amplification band. In other words, a frequency-phase deviation is not produced in the amplification band between signals outputted from the amplifiers 36a and 36b, and, as indicated in FIG. 12, the phase characteristic is flat in the amplification band.

Figure 14:
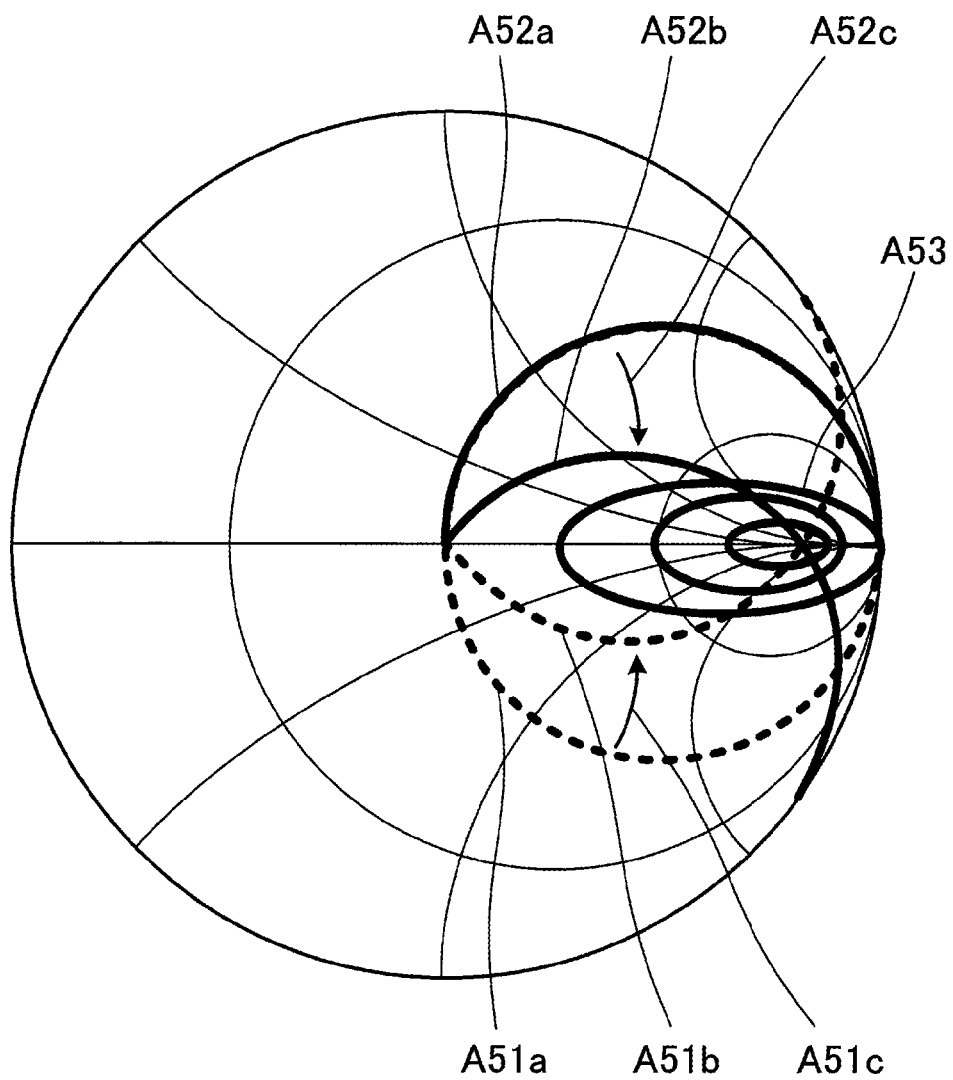
FIG. 14 is a view for describing the reflection characteristic of the combining circuit illustrated in FIG. 11.

FIG. 14 is a view for describing the reflection characteristic of the combining circuit illustrated in FIG. 11. FIG. 14 is a Smith chart.

A dashed-line semicircle A51a indicates a locus of a reflection coefficient in the amplifier 36a at the time of the lines 61 through 64 illustrated in FIG. 11 being $\lambda/4$ in length. A dashed-line semicircle A51b indicates a locus of a reflection coefficient in the amplifier 36a at the time of the line 63 being shortened by $\delta$. By shortening the line 63, as indicated by an arrow A51c, the semicircle A51a rotates to the semicircle A51b.

A solid-line semicircle A52a indicates a locus of a reflection coefficient in the amplifier 36b at the time of the lines 61 through 64 illustrated in FIG. 11 being $\lambda/4$ in length. A solid-line semicircle A52b indicates a locus of a reflection coefficient in the amplifier 36b at the time of the line 62 being lengthened by $\gamma$. By lengthening the line 62, as indicated by an arrow A52c, the semicircle A52a rotates to the semicircle A52b.

A contour line A53 is an efficiency contour line. As the center of the contour line A53 is approached, the efficiency of the amplification apparatus increases.

As stated above, the combining circuit 39 includes the lines 62 and 63 which are asymmetrical circuit elements. As a result, its phase characteristic is flat at the output terminal Pout. Furthermore, the combining circuit 39 includes the lines 62 and 63 which are asymmetrical circuit elements, so, as indicated by the semicircles A51b and A52b of FIG. 14, the loci of a reflection coefficient pass through the vicinity of the center of the contour line A53 in which the efficiency of the amplification apparatus is high. That is to say, the combining circuit 39 includes asymmetrical circuit elements. This also increases the efficiency of the amplification apparatus.

As has been described, the amplification apparatus includes the impedance inverting circuit 38 on the output side of one of the two amplifiers 36a and 36b and the combining circuit 39 includes asymmetrical circuit elements. This makes it possible to increase the efficiency of the amplification apparatus by the impedance inverting circuit 38 and to make its phase characteristic flat and further increase its efficiency by the combining circuit 39 which performs phase correction and combination and which includes asymmetrical circuit elements.

Third Embodiment

A third embodiment will now be described in detail with reference to the accompanying drawing. In the second embodiment the combining circuit includes asymmetrical circuit elements. In a third embodiment asymmetrical circuit elements are coupled to the output sides of two amplifiers.

Figure 15:
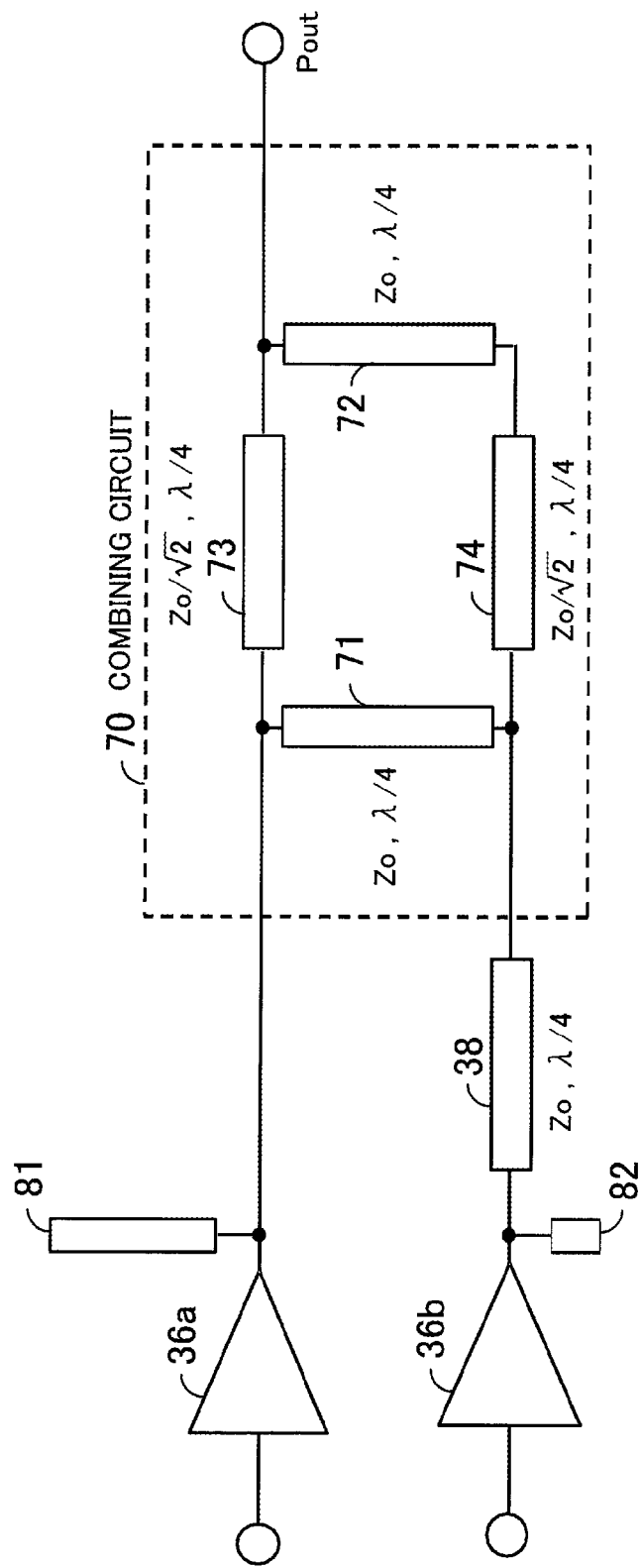
FIG. 15 illustrates an amplification apparatus according to a third embodiment.

FIG. 15 illustrates an amplification apparatus according to a third embodiment. Components in FIG. 15 which are the same as those illustrated in FIG. 11 are marked with the same numerals and description of them will be omitted. As illustrated in FIG. 15, an amplification apparatus includes a combining circuit 70 and open stubs 81 and 82.

The combining circuit 70 includes lines 71 through 74. The combining circuit 70 is a 90-degree branch-line combining circuit. Each of the lines 71 and 72 has a characteristic impedance of Zo. Each of the lines 73 and 74 has a characteristic impedance of $Zo/\sqrt{2}$. In addition, the lines 71 through 74 are $\lambda/4$ in length.

The open stub 81 is coupled in parallel with an output line of an amplifier 36a. The open stub 82 is coupled in parallel with an output line of an amplifier 36b. The open stubs 81 and 82 differ in length and are asymmetrical circuit elements. The lengths of the open stubs 81 and 82 are designed so that, as indicated in FIG. 12, the phase characteristic will be flat in an amplification band.

With the amplification apparatus illustrated in FIG. 15, the combining circuit 70 is a 90-degree branch-line combining circuit and does not include asymmetrical circuit elements. With the amplification apparatus illustrated in FIG. 15, a difference in phase due to a difference in signal path which arises from the insertion of an impedance inverting circuit 38 is controlled by the open stubs 81 and 82.

As has been described, the amplification apparatus according to the third embodiment includes the impedance inverting circuit 38 on the output side of one of the two amplifiers 36a and 36b and the open stubs 81 and 82, which are asymmetrical circuit elements, are coupled to the output sides of the amplifiers 36a and 36b respectively. This makes it possible to increase the efficiency of the amplification apparatus by the impedance inverting circuit 38 and to make its phase characteristic flat and further increase its efficiency by the open stubs 81 and 82, which are asymmetrical circuit elements.

Fourth Embodiment

A fourth embodiment will now be described in detail with reference to the accompanying drawing. In a fourth embodiment, unlike the third embodiment, an open stub is coupled to the output side of one of two amplifiers. Furthermore, the line length of an impedance inverting circuit is longer than $\lambda/4$ and the impedance inverting circuit is an asymmetrical circuit element.

Figure 16:
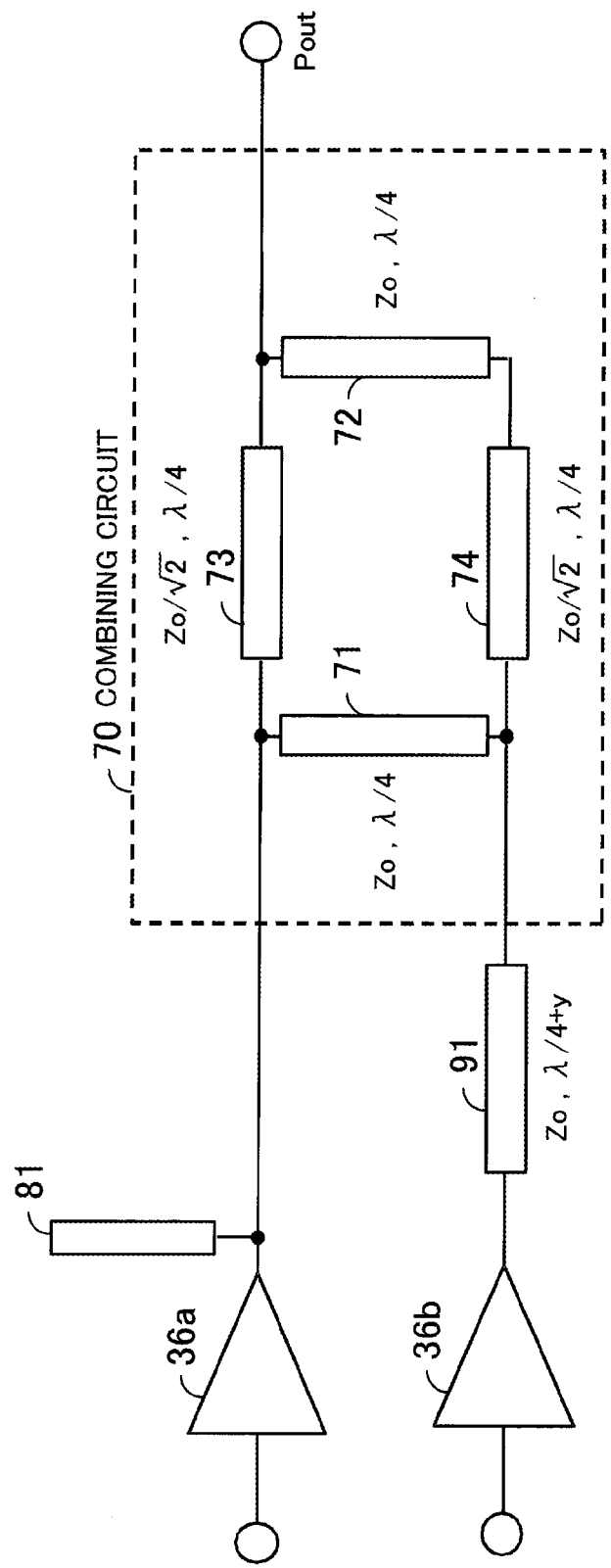
FIG. 16 illustrates an amplification apparatus according to a fourth embodiment.

FIG. 16 illustrates an amplification apparatus according to a fourth embodiment. Components in FIG. 16 which are the same as those illustrated in FIG. 15 are marked with the same numerals and description of them will be omitted. As illustrated in FIG. 16, an amplification apparatus includes an impedance inverting circuit 91.

The impedance inverting circuit 91 has a characteristic impedance of Zo and is a line which is $(\lambda/4)+y$ in length.

Unlike the amplification apparatus illustrated in FIG. 15, the amplification apparatus illustrated in FIG. 16 does not include an open stub 82. In addition, the line length of the impedance inverting circuit 91 is $(\lambda/4)+y$. That is to say, the amplification apparatus illustrated in FIG. 16 does not include an open stub 82, but, on the other hand, the line length of the impedance inverting circuit 91 is increased from $\lambda/4$ to $(\lambda/4)+y$. An open stub 81 and the impedance inverting circuit 91 are asymmetrical circuit elements.

That is to say, with the amplification apparatus illustrated in FIG. 16, a difference in phase due to a difference in signal path which arises from the insertion of the impedance inverting circuit 91 is controlled by the open stub 81 and the impedance inverting circuit 91 which are asymmetrical circuit elements.

As has been described, the amplification apparatus according to the fourth embodiment includes the impedance inverting circuit 91, which is an asymmetrical circuit element, on the output side of one of two amplifiers 36a and 36b and the open stub 81, which is an asymmetrical circuit element, is coupled to the output side of the other of the two amplifiers 36a and 36b. This makes it possible to increase the efficiency of the amplification apparatus by the impedance inverting circuit 91 and to make its phase characteristic flat and further increase its efficiency by the open stub 81 and the impedance inverting circuit 91 which make phase correction and which are asymmetrical circuit elements.

Fifth Embodiment

A fifth embodiment will now be described in detail with reference to the accompanying drawing. In a fifth embodiment, unlike the fourth embodiment, an open stub is not included and a combining circuit includes asymmetrical circuit elements.

Figure 17:
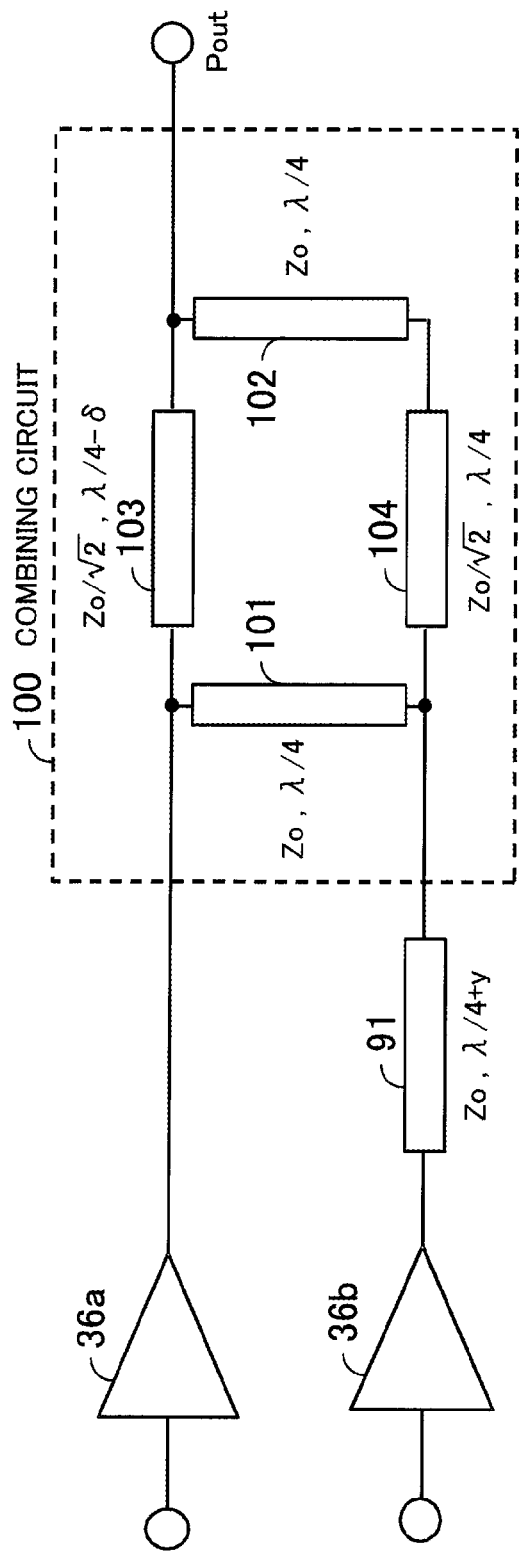
FIG. 17 illustrates an amplification apparatus according to a fifth embodiment.

FIG. 17 illustrates an amplification apparatus according to a fifth embodiment. Components in FIG. 17 which are the same as those illustrated in FIG. 16 are marked with the same numerals and description of them will be omitted. As illustrated in FIG. 17, an amplification apparatus includes a combining circuit 100.

The combining circuit 100 includes lines 101 through 104. Each of the lines 101 and 102 has a characteristic impedance of Zo. Each of the lines 103 and 104 has a characteristic impedance of $Zo/\sqrt{2}$. In addition, the lines 101, 102, and 104 are $\lambda/4$ in length. The line 103 is $(\lambda/4)-\delta$ in length.

Unlike the amplification apparatus illustrated in FIG. 16, the line 103 included in the combining circuit 100 of the amplification apparatus illustrated in FIG. 17 is $(\lambda/4)-\delta$ in length. In addition, an open stub 81 is not included. That is to say, the amplification apparatus illustrated in FIG. 17 does not include an open stub 81, but, on the other hand, the length of the line 103 included in the combining circuit 100 is reduced from $\lambda/4$ to $(\lambda/4)-\delta$. The line 103 coupled to an output terminal Pout and an impedance inverting circuit 91 are asymmetrical circuit elements.

That is to say, with the amplification apparatus illustrated in FIG. 17, a difference in phase due to a difference in signal path which arises from the insertion of the impedance inverting circuit 91 is controlled by the combining circuit 100 including the line 103, which is an asymmetrical circuit element, and the impedance inverting circuit 91 which is an asymmetrical circuit element.

As has been described, the amplification apparatus according to the fifth embodiment includes the impedance inverting circuit 91, which is an asymmetrical circuit element, on the output side of one of two amplifiers 36a and 36b and the combining circuit 100 includes the line 103, which is an asymmetrical circuit element. This makes it possible to increase the efficiency of the amplification apparatus by the impedance inverting circuit 91 and to make its phase characteristic flat and further increase its efficiency by the combining circuit 100 including an asymmetrical circuit element and the impedance inverting circuit 91 which is an asymmetrical circuit element.

Sixth Embodiment

A sixth embodiment will now be described in detail with reference to the accompanying drawing. In a sixth embodiment, unlike the fifth embodiment, the line length of an impedance inverting circuit is $\lambda/4$ and a combining circuit includes an open stub which is an asymmetrical circuit element.

Figure 18:
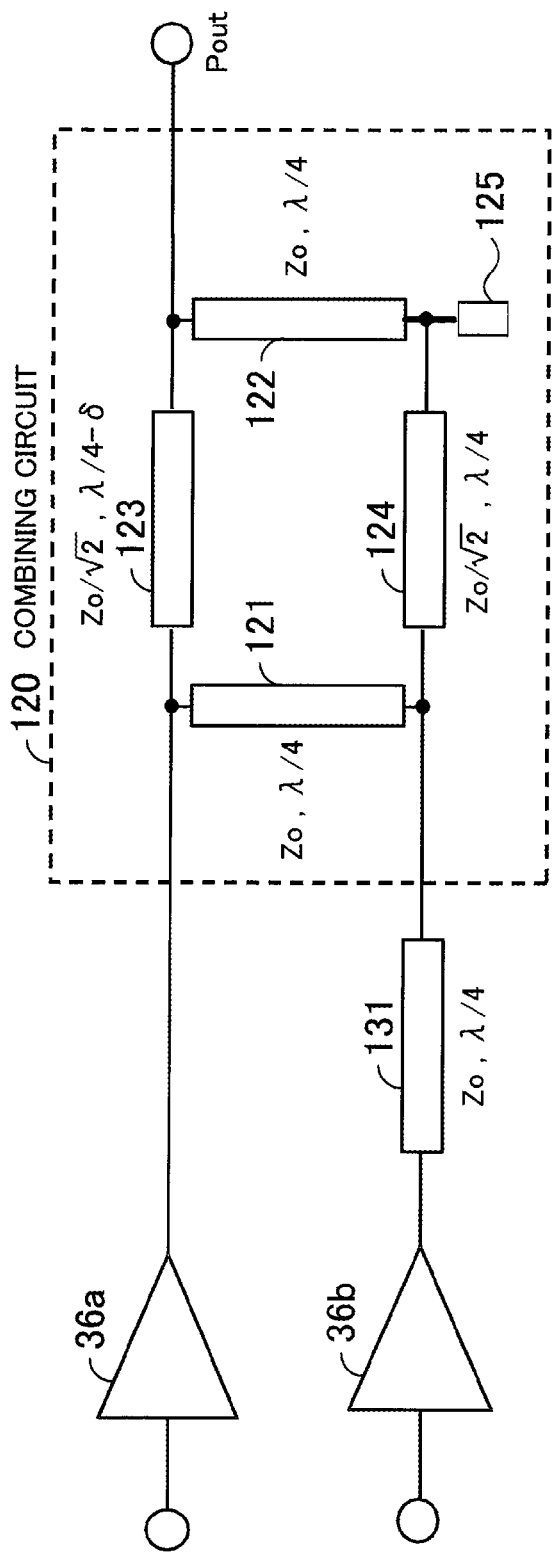
FIG. 18 illustrates an amplification apparatus according to a sixth embodiment.

FIG. 18 illustrates an amplification apparatus according to a sixth embodiment. Components in FIG. 18 which are the same as those illustrated in FIG. 17 are marked with the same numerals and description of them will be omitted. As illustrated in FIG. 18, an amplification apparatus includes a combining circuit 120 and an impedance inverting circuit 131.

The combining circuit 120 includes lines 121 through 124. Each of the lines 121 and 122 has a characteristic impedance of Zo. Each of the lines 123 and 124 has a characteristic impedance of Zo/$\sqrt{2}$. In addition, the lines 121, 122, and 124 are $\lambda/4$ in length. The line 123 is $(\lambda/4)-\delta$ in length. An open stub 125 is coupled at a point at which the lines 122 and 124 are coupled.

The impedance inverting circuit 131 is a line having a characteristic impedance of Zo and a length of $\lambda/4$.

Unlike the amplification apparatus illustrated in FIG. 17, the line length of the impedance inverting circuit 131 included in the amplification apparatus illustrated in FIG. 18 is reduced from $(\lambda/4)+y$ to $\lambda/4$. In addition, the open stub 125 is coupled at the point in the combining circuit 120 at which the lines 122 and 124 are coupled. That is to say, the line length of the impedance inverting circuit 131 included in the amplification apparatus illustrated in FIG. 18 is reduced from $(\lambda/4)+y$ to $\lambda/4$, but, on the other hand, the combining circuit 120 includes the open stub 125. The line 123 coupled to an output terminal Pout and the open stub 125 are asymmetrical circuit elements.

That is to say, with the amplification apparatus illustrated in FIG. 18, a difference in phase due to a difference in signal path which arises from the insertion of the impedance inverting circuit 131 is controlled by the combining circuit 120 including the line 123 and the open stub 125, which are asymmetrical circuit elements.

As has been described, the amplification apparatus according to the sixth embodiment includes the impedance inverting circuit 131 on the output side of one of two amplifiers 36a and 36b and the combining circuit 120 includes the line 123 and the open stub 125, which are asymmetrical circuit elements. This makes it possible to increase the efficiency of the amplification apparatus by the impedance inverting circuit 131 and to make its phase characteristic flat and further increase its efficiency by the combining circuit 120 including asymmetrical circuit elements.

Seventh Embodiment

A seventh embodiment will now be described in detail with reference to the accompanying drawing. In a seventh embodiment, unlike the sixth embodiment, an open stub is coupled to the output side of one of two amplifiers. In addition, a combining circuit includes an open stub which is an asymmetrical circuit element.

Figure 19:
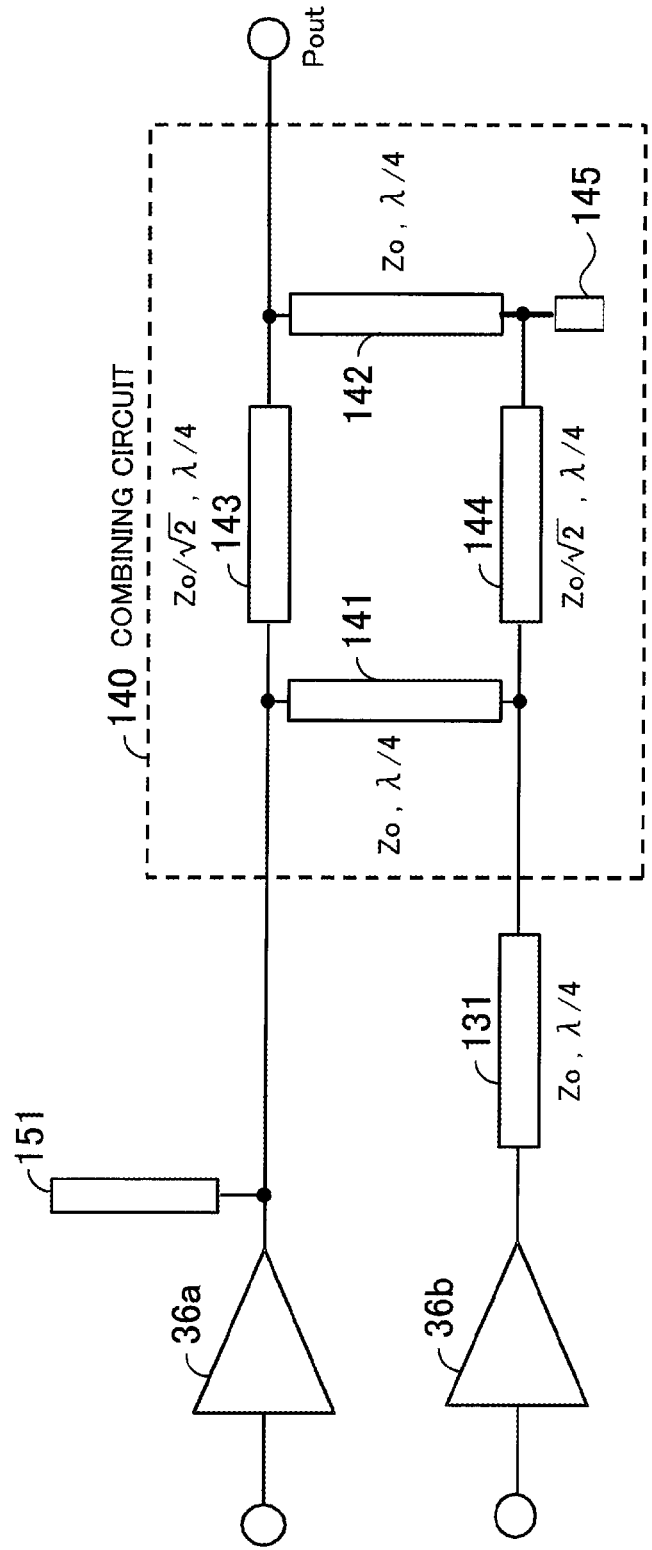
FIG. 19 illustrates an amplification apparatus according to a seventh embodiment.

FIG. 19 illustrates an amplification apparatus according to a seventh embodiment. Components in FIG. 19 which are the same as those illustrated in FIG. 18 are marked with the same numerals and description of them will be omitted. As illustrated in FIG. 19, an amplification apparatus includes a combining circuit 140 and an open stub 151.

The combining circuit 140 includes lines 141 through 144. Each of the lines 141 and 142 has a characteristic impedance of Zo. Each of the lines 143 and 144 has a characteristic impedance of Zo/$\sqrt{2}$. In addition, the lines 141 through 144 are $\lambda/4$ in length. An open stub 145 is coupled at a point at which the lines 142 and 144 are coupled.

An open stub 151 is coupled in parallel with an output line of an amplifier 36a.

Unlike the amplification apparatus illustrated in FIG. 18, the length of the line 143 included in the combining circuit 140 of the amplification apparatus illustrated in FIG. 19 is increased from $(\lambda/4)-\delta$ to $\lambda/4$. In addition, the open stub 151 is coupled to the output side of the amplifier 36a. That is to say, the length of the line 143 included in the combining circuit 140 of the amplification apparatus illustrated in FIG. 19 is increased from $(\lambda/4)-\delta$ to $\lambda/4$, but, on the other hand, the open stub 151 is coupled in parallel with the output line of the amplifier 36a.

That is to say, with the amplification apparatus illustrated in FIG. 19, a difference in phase due to a difference in signal path which arises from the insertion of an impedance inverting circuit 131 is controlled by the combining circuit 140 including the open stub 145, which is an asymmetrical circuit element, and the open stub 151, which is an asymmetrical circuit element.

As has been described, the amplification apparatus according to the seventh embodiment includes the impedance inverting circuit 131 on the output side of one of two amplifiers 36a and 36b, the open stub 151 is coupled to the output side of the amplifier 36a, and the combining circuit 140 includes the open stub 145, which is an asymmetrical circuit element. This makes it possible to increase the efficiency of the amplification apparatus by the impedance inverting circuit 131 and to make its phase characteristic flat and further increase its efficiency by the combining circuit 140 including an asymmetrical circuit element and the open stub 151.

Eighth Embodiment

An eighth embodiment will now be described in detail with reference to the accompanying drawing. In an eighth embodiment, unlike the seventh embodiment, an open stub coupled to the output side of an amplifier is not used and the line length of an impedance inverting circuit is set to $(\lambda/4)-\delta$.

Figure 20:
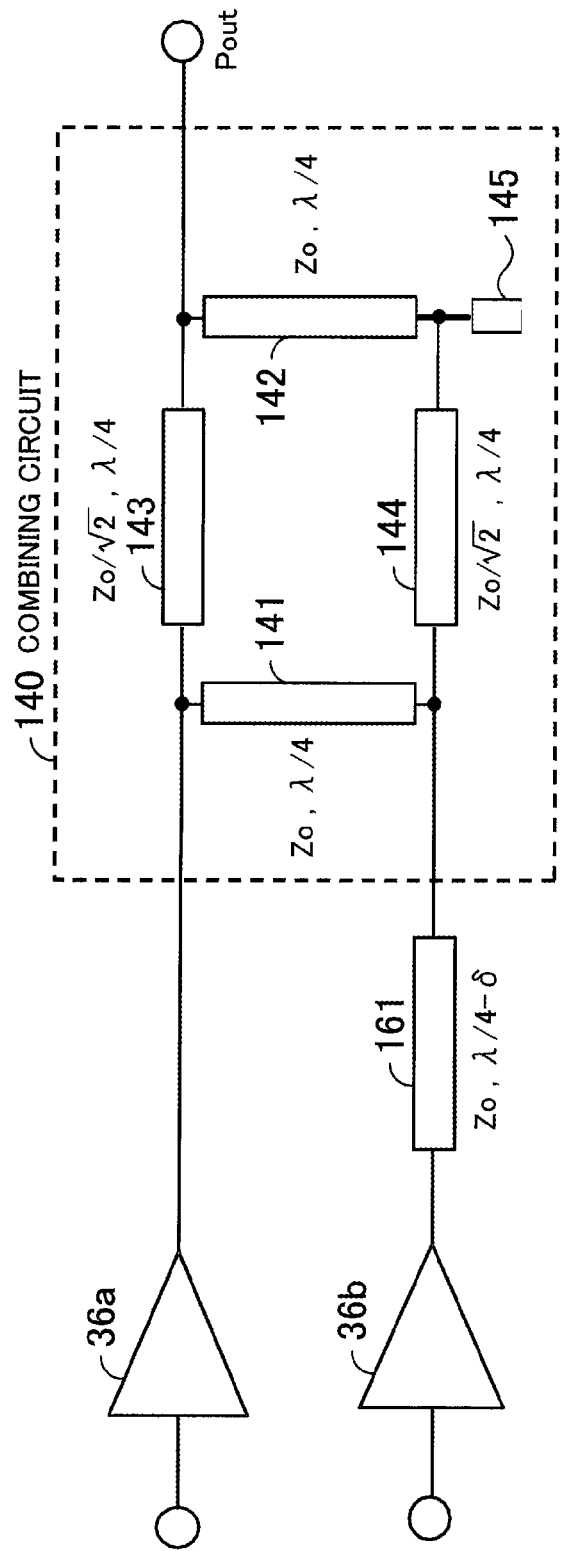
FIG. 20 illustrates an amplification apparatus according to an eighth embodiment.

FIG. 20 illustrates an amplification apparatus according to an eighth embodiment. Components in FIG. 20 which are the same as those illustrated in FIG. 19 are marked with the same numerals and description of them will be omitted. As illustrated in FIG. 20, an amplification apparatus includes an impedance inverting circuit 161.

The impedance inverting circuit 161 is a line having a characteristic impedance of Zo and a length of $(\lambda/4)-\delta$.

Unlike the amplification apparatus illustrated in FIG. 19, the amplification apparatus illustrated in FIG. 20 does not include an open stub 151 coupled to the output side of an amplifier 36a. In addition, the line length of the impedance inverting circuit 161 is reduced from $\lambda/4$ to $(\lambda/4)-\delta$. That is to say, the amplification apparatus illustrated in FIG. 20 does not include an open stub 151 coupled to the output side of the amplifier 36a, but, on the other hand, the line length of the impedance inverting circuit 161 is reduced from $\lambda/4$ to $(\lambda/4)-\delta$.

That is to say, with the amplification apparatus illustrated in FIG. 20, a difference in phase due to a difference in signal path which arises from the insertion of the impedance inverting circuit 161 is controlled by the impedance inverting circuit 161, which is an asymmetrical circuit element, and a combining circuit 140 including an open stub 145, which is an asymmetrical circuit element.

As has been described, the amplification apparatus according to the eighth embodiment includes the impedance inverting circuit 161, which is an asymmetrical circuit element, on the output side of one of two amplifiers 36a and 36b and the combining circuit 140 includes the open stub 145, which is an asymmetrical circuit element. This makes it possible to increase the efficiency of the amplification apparatus by the impedance inverting circuit 161 and to make its phase characteristic flat and further increase its efficiency by the combining circuit 140 including an asymmetrical circuit element and the impedance inverting circuit 161, which is an asymmetrical circuit element.

According to the disclosed apparatus, high efficiency and a flat phase characteristic in an amplification band can be obtained.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An amplification apparatus for generating two constant amplitude signals from an input signal by vector decomposition and amplifying the two constant amplitude signals, the apparatus comprising:
    a first amplification section which amplifies a first signal obtained by the vector decomposition;
    a second amplification section which amplifies a second signal obtained by the vector decomposition;
    an impedance inverting circuit which inverts impedance of the second signal amplified by the second amplification section; and
    a combining circuit which corrects a phase of the first signal amplified by the first amplification section and a phase of the second signal whose impedance is inverted by the impedance inverting circuit and which combines and outputs the first signal and the second signal, the combining circuit being implemented via transmission lines with a tetragon configuration;
    the combining circuit including asymmetrical circuit elements or the asymmetrical circuit elements being inserted between the first amplification section or the second amplification section and the combining circuit.

2. The amplification apparatus according to claim 1, wherein:
    the combining circuit includes:
        a first line and a second line coupled in parallel to output sides of the first amplification section and the second amplification section; and
        a third line and a fourth line coupled in series between the first line and the second line, and
    the second line and the third line are the asymmetrical circuit elements.

3. The amplification apparatus according to claim 1 further comprising:
    a first open stub coupled to an output side of the first amplification section; and
    a second open stub coupled to an output side of the second amplification section,
    wherein the first open stub and the second open stub are the asymmetrical circuit elements.

4. The amplification apparatus according to claim 1 further comprising an open stub coupled to an output side of the first amplification section, wherein the open stub and the impedance inverting circuit are the asymmetrical circuit elements.

5. The amplification apparatus according to claim 1, wherein:
    the combining circuit includes:
        a first line and a second line coupled in parallel to output sides of the first amplification section and the second amplification section; and
        a third line and a fourth line coupled in series between the first line and the second line, and
    the third line and the impedance inverting circuit are the asymmetrical circuit elements.

6. The amplification apparatus according to claim 1, wherein:
    the combining circuit includes:
        a first line and a second line coupled in parallel to output sides of the first amplification section and the second amplification section;
        a third line and a fourth line coupled in series between the first line and the second line; and
        an open stub coupled at a point at which the second line and the fourth line are coupled, and
    the third line and the open stub are the asymmetrical circuit elements.

7. The amplification apparatus according to claim 1 further comprising a first open stub coupled to an output side of the first amplification section,
    wherein:
    the combining circuit includes:
        a first line and a second line coupled in parallel to output sides of the first amplification section and the second amplification section;
        a third line and a fourth line coupled in series between the first line and the second line; and
        a second open stub coupled at a point at which the second line and the fourth line are coupled, and
    the first open stub and the second open stub are the asymmetrical circuit elements.

8. The amplification apparatus according to claim 1, wherein:
    the combining circuit includes:
        a first line and a second line coupled in parallel to output sides of the first amplification section and the second amplification section;
        a third line and a fourth line coupled in series between the first line and the second line; and
        an open stub coupled at a point at which the second line and the fourth line are coupled, and the impedance inverting circuit and the open stub are the asymmetrical circuit elements.

* * * * *